United States Patent
Ikuta

(10) Patent No.: US 6,716,768 B2
(45) Date of Patent: Apr. 6, 2004

(54) METHOD OF MANUFACTURING THIN-FILM TRANSISTOR, AND LIQUID-CRYSTAL DISPLAY

(75) Inventor: Shigeo Ikuta, Hirakata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/204,079

(22) PCT Filed: Feb. 15, 2001

(86) PCT No.: PCT/JP01/01072

§ 371 (c)(1),
(2), (4) Date: Aug. 15, 2002

(87) PCT Pub. No.: WO01/61760

PCT Pub. Date: Aug. 23, 2001

(65) Prior Publication Data

US 2003/0003616 A1 Jan. 2, 2003

(30) Foreign Application Priority Data

Feb. 15, 2000 (JP) ........................................ 2000-036121

(51) Int. Cl.⁷ ........................ H10L 21/31; H10L 21/469
(52) U.S. Cl. ........................ 438/770; 438/197; 438/510
(58) Field of Search .................... 438/30, 149, 153, 438/154, 197, 199, 201, 202–206, 289, 290, 308, 309, 381, 486, 510, 514, 662, 663, 672, 675, 770–773, 491, 494, 498, 499

(56) References Cited

U.S. PATENT DOCUMENTS

| | | | | |
|---|---|---|---|---|
| 5,843,833 A | * | 12/1998 | Ohtani et al. | 438/486 |
| 5,994,172 A | * | 11/1999 | Ohtani et al. | 438/151 |
| 6,424,012 B1 | * | 7/2002 | Kawasaki et al. | 257/350 |

FOREIGN PATENT DOCUMENTS

| | | |
|---|---|---|
| JP | 61-99347 | 5/1986 |
| JP | 4-145624 | 5/1992 |
| JP | 5-21463 | 1/1993 |
| JP | 5-29307 | 2/1993 |
| JP | 5-291295 | 11/1993 |
| JP | 6-252116 | 9/1994 |
| JP | 10-189532 | 7/1998 |
| JP | 11-40541 | 2/1999 |
| JP | 11-354801 | 12/1999 |
| WO | 97/49125 | 12/1997 |

\* cited by examiner

*Primary Examiner*—David Nhu
(74) *Attorney, Agent, or Firm*—Merchant & Gould P. C.

(57) ABSTRACT

The invention provides a method of manufacturing a thin-film transistor whose semiconductor surface is protected. The surface of semiconductor formed on a substrate is exposed to ozone-containing water to form a surface-oxidized layer on the surface. A mask formed for etching or ion implantation is removed with the layer formed at least on an exposed portion of the surface.

26 Claims, 7 Drawing Sheets

(a)

(b)

(c)

(d)

(e)

METHOD OF MANUFACTURING THIN-FILM TRANSISTOR, AND LIQUID-CRYSTAL DISPLAY

TECHNICAL FIELD

The present invention relates to a method of manufacturing a thin-film transistor and a liquid crystal display.

BACKGROUND ART

A thin-film transistor (TFT) in a liquid crystal display is composed of a silicon film and other films that are formed on an insulating substrate such as a glass substrate, and used as a switching element provided for a pixel of the liquid crystal display or a driver element in a peripheral circuit. As a silicon film for a TFT, an amorphous silicon film is used in many cases. In recent years, however, a polycrystalline silicon (hereinafter also referred to as simply "polysilicon") film that has higher characteristics has been used, and now is being developed increasingly.

Hereinafter, as an example of a conventional method of manufacturing a thin-film transistor, a method of manufacturing a top gate polysilicon TFT will be explained with reference to FIG. 6. The below mentioned method includes steps up to a step of depositing a gate insulating film.

First, an amorphous silicon film is deposited on the entire surface of a substrate 31, followed by crystallization to make the amorphous silicon film into a polysilicon film 32 (FIG. 6(a)). Then, the polysilicon film 32 is subjected to patterning into a predetermined island pattern so as to be formed into a semiconductor layer of a transistor. This patterning generally is carried out as follows. First, a photoresist is coated on the polysilicon film 32 and dried, followed by exposure and development to form a predetermined resist pattern 34 (FIG. 6(b)). Next, the polysilicon film 32 is etched partially away by using the resist pattern 34 as a mask (FIG. 6(c)). Thereafter, the resist pattern 34 is removed by, for example, immersing it in a peeling solution (FIG. 6(d)). A SiO$_2$ film 35 as a gate insulating film is deposited so that it covers the thus obtained polysilicon film 32 with a predetermined pattern (FIG. 6(e)).

Furthermore, in the method of manufacturing the polysilicon TFT, a process in which impurities directly are implanted into the polysilicon film may be used. A conventional example of this process will be explained with reference to FIG. 7.

As in the above-mentioned conventional example, a polysilicon film 32 is formed in an island form on a substrate 31 (FIG. 7(a)). Impurities such as phosphorus (P) are implanted selectively into predetermined regions on the polysilicon film. First, a photoresist is coated on the polysilicon film 32 and dried, followed by exposure and development to form a resist pattern 34 on a region into which impurities are not implanted (a region to be formed into a channel) (FIG. 7(b)). Next, impurity ions 38, for example, P ions etc. are implanted into the polysilicon film 32 by using the resist pattern 34 as a mask so as to form a region into which impurities are implanted (regions to be formed in source and drain regions) 37 (FIG. 7(c)). Thereafter, the resist pattern 34 is removed, by, for example, immersing it in a peeling solution (FIG. 7(d)). A SiO$_2$ film 35 as a gate insulating film is deposited so that it covers the thus obtained polysilicon film 32 (FIG. 7(e)).

When a polysilicon TFT is formed in the method shown in FIGS. 6 and 7, polysilicon inevitably is exposed to the peeling solution in a step of peeling off the resist, and the surface of polysilicon may be chemically deteriorated or may be etched slightly due to alkaline components in the peeling solution. Furthermore, a subsequent step may proceed with the peeling solution or components of the resist remaining on the surface of the polysilicon. As a result, there arises a problem in that deterioration of the TFT properties, for example, a shortage of ON-state current, variation of threshold voltage, may be caused. In particular, it is desired that a thin-film transistor used for a liquid crystal display secures the reliability of products by suppressing the above-mentioned deterioration of a TFT over the entire region of a large-sized substrate.

DISCLOSURE OF THE INVENTION

It is therefore an object of the present invention to provide a method of manufacturing a thin-film transistor excellent in characteristics and reliability and also to provide a liquid crystal display manufactured by using this method.

The method of manufacturing a thin-film transistor of the present invention includes: bringing a surface of a semiconductor film formed on a substrate into contact with ozone-containing water to form a surface-oxidized layer on the surface, forming a predetermined pattern mask on the semiconductor film directly or via another film, carrying out either of processes selected from etching and impurity ion implantation by using the mask, and removing the mask with the surface-oxidized layer being formed at least on an exposed portion of the surface of the semiconductor film.

With the manufacturing method of the present invention, since the surface-oxidized layer is formed, the semiconductor film is not exposed directly to the peeling solution. Therefore, it is possible to suppress the deterioration or erosion of the semiconductor film. It also is possible to suppress the components of the mask or the peeling solution from remaining on the semiconductor film. Furthermore, since the manufacturing method of the present invention uses the ozone-containing water, it is possible to oxidize the surface of the semiconductor film rapidly and uniformly. Therefore, the manufacturing method using ozone-containing water of the present invention is particularly suitable for manufacturing a liquid crystal display including a large-sized substrate.

In the above-mentioned manufacturing method, the surface-oxidized layer may remain. However, it is preferable that the above-mentioned method further includes removing the surface-oxidized layer after the mask is removed. This is because even if contaminants such as the above-mentioned components remain on the surface-oxidized layer, the contaminants can be removed together with the surface-oxidized layer.

The above-mentioned manufacturing method further may include removing a surface layer of the semiconductor film before the surface-oxidized layer is formed. If contaminants are removed in advance, the surface of the semiconductor film further can be kept clean.

The thickness of the surface-oxidized layer is suitably in the range from 0.5 nm to 5 nm, and particularly suitably in the range from 1 nm to 5 nm. When this thickness is too thin, the effect of protecting the surface cannot be obtained sufficiently. On the other hand, when the film thickness of the surface-oxidized layer is too thick, although the effect of protecting the surface of the semiconductor film can still be obtained, there may arise a problem in that the other exposed surface such as a glass surface, may be etched in the step of removing the surface-oxidized layer.

As a pattern mask, a photoresist is used in many cases. In this case, for removing the photoresist, an alkaline peeling solution may be used.

As the semiconductor film, in general, at least one selected from a polycrystalline silicon film and an amorphous silicon film is used. However, when the present invention is used particularly for a polysilicon film, a greater effect can be obtained. This is because the polysilicon film is more excellent in the electric property than an amorphous silicon film, but it is susceptible to the surface contamination.

The typical step in which the present invention preferably is used is a process (etching or impurity ions implantation) of a semiconductor film with a mask. However, the present invention is not necessarily limited to these and similarly can be used for any other step when the step requires removing a mask with the surface of a semiconductor film exposed. For example, in the step in which a mask with a predetermined pattern is formed on a semiconductor film via at least one insulating film and the insulating film is etched by the use of this mask, the surface of the semiconductor film is exposed by the etching of the insulating film. Therefore, also in this step, in the step of removing the mask after etching, a surface of the semiconductor layer may be brought into contact with ozone-containing water to form a surface-oxidized layer at least on an exposed portion of the surface of the semiconductor layer.

Thus, in the manufacturing method of the present invention, the mask may be formed directly on the semiconductor film. However, the present invention is not necessarily limited to this, and one or two or more layer(s) may be interposed between the semiconductor film and the mask. Furthermore, the surface-oxidized layer may be formed at any time before the mask is removed. In some embodiments, the surface-oxidized layer is not necessarily formed before the mask is formed.

The liquid crystal display disclosed in the present invention includes a thin-film transistor manufactured by using the manufacturing method of the present invention. This liquid crystal display generally includes a thin-film transistor array disposed on a glass substrate, reflecting excellent characteristics and reliability of the thin-film transistor obtained by using the manufacturing method of the present invention.

DESCRIPTION OF THE PREFERRED EMBODIMENTS

Figure 1:
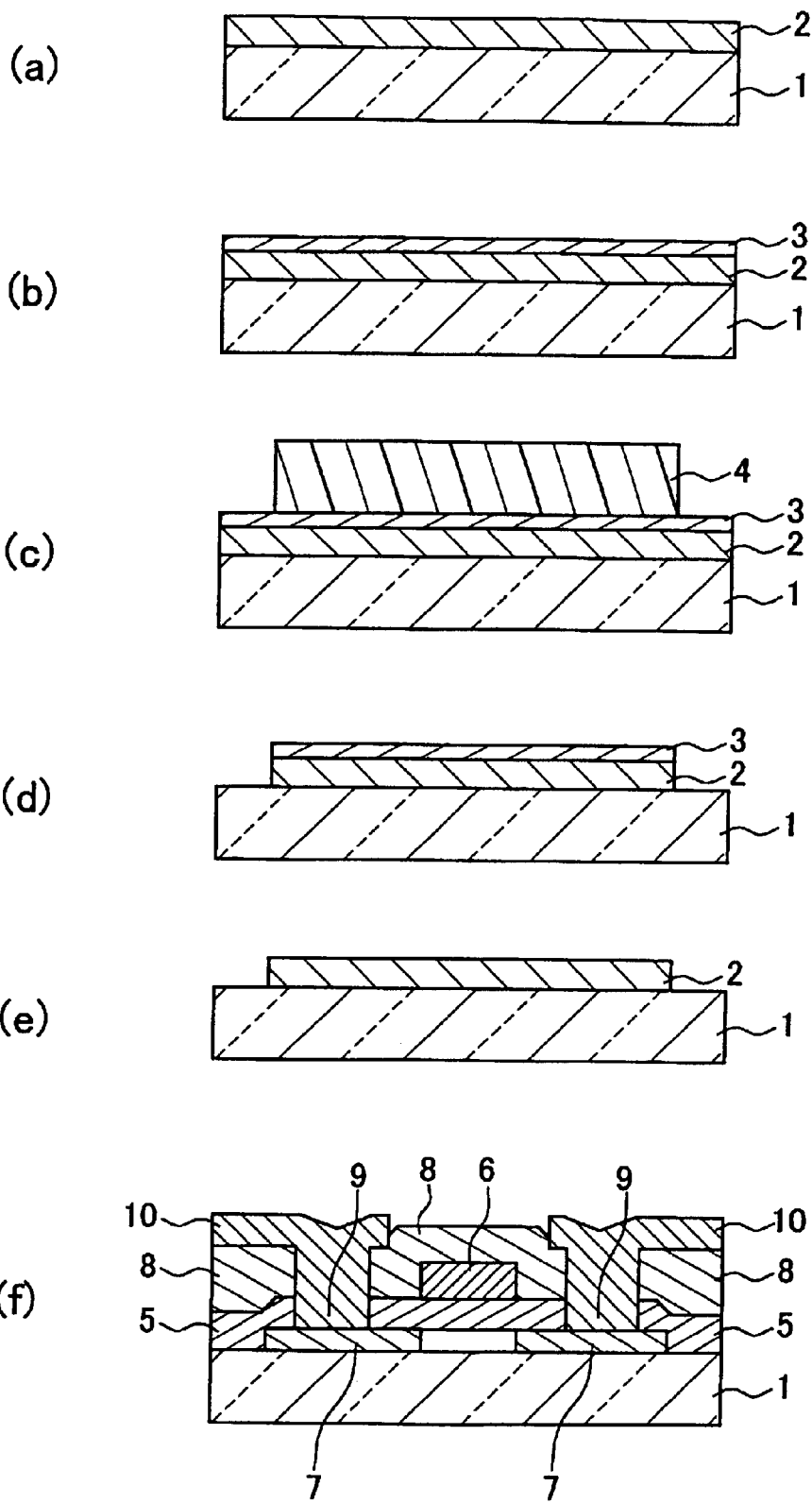
FIG. 1 is a view showing steps of a manufacturing method according to one embodiment of the present invention.

Hereinafter, embodiments of the present invention will be explained in detail with reference to drawings.

(First Embodiment)
[Etching Process of Silicon Thin Film]

In a first embodiment, an example in which the present invention is used in a step of etching a polysilicon film in a manufacturing process of a polysilicon TFT will be explained.

First, a polysilicon film 2 is formed on a glass substrate 1 as follows (FIG. 1(a)). Although not shown in the drawings, on the glass substrate (for example, #1737 manufactured by Corning Incorporated), in order to prevent impurities from diffusing, a $SiO_2$ film may be adhered if necessary. On the glass substrate 1, an amorphous silicon film with a film thickness of 30–150 nm is formed by, for example, a reduced-pressure CVD method, and then the amorphous silicon is crystallized by a laser annealing process using, for example, a XeCl excimer laser. Thus, a polysilicon film 2 is obtained.

Next, by oxidizing the surface of the polysilicon film 2, a surface-oxidized layer 3 with a thickness of about 1 to 5 nm is formed (FIG. 1(b)). In the formation of the surface-oxidized layer, water in which ozone is dissolved (ozone water) is used. The use of ozone water enables the formation of the surface-oxidized layer 3 having excellent uniformity in thickness over the entire surface of the substrate without damaging the polysilicon film 2. Moreover, the oxidation with ozone water can be carried out at low cost. Furthermore, since ozone water has a washing effect as well, it is possible to remove dirt such as microparticles on the surface of the substrate. For example, ozone water may be dripped onto the surface of the polysilicon film while rotating the substrate.

It is preferable that the ozone concentration in the ozone water is 5 mg/L or more. A too low ozone concentration may lead to an insufficient thickness of the surface-oxidized layer. The upper limit of the ozone concentration is not particularly limited. However, when the ozone concentration is too high, it is necessary to use specific materials and coating in order to secure the durability of a device. Therefore, the suitable ozone concentration is 25 mg/L or less. In the case where the ozone concentration is 5–25 mg/L, the treatment time may be several seconds. However, if the treatment is carried out for, for example, 10 seconds to 3 minutes, an oxidized layer having a sufficient thickness can be obtained.

Note here that prior to the formation of the surface-oxidized layer, the surface of the polysilicon film may be brought into contact with dilute hydrofluoric acid, buffered hydrofluoric acid, or the like to remove the surface layer of the film. This is because the degree of washing the surface of the polysilicon film can be enhanced.

Next, a step for leaving the polysilicon film 2 only in a region in which a TFT is formed by photolithography and etching is carried out. In the step of photolithography, first, a photoresist is coated by a method such as a spin coating, followed by exposure and development so as to obtain a predetermined resist pattern 4 (FIG. 1(c)). As the resist pattern, for example, a positive photoresist (OFPR-800 manufactured by TOKYO OHKA KOGYO CO., LTD. etc.) can be used and the film thickness may be set at, for example, about 2 $\mu$m and the pre-baking temperature may be set at, for example, about 90° C. In the development after exposure, for example, an organic alkaline developing solution (NMD-W manufactured by TOKYO OHKA KOGYO CO., LTD. etc.) can be used.

In the step of etching, the polysilicon film 2 is etched so as to leave the polysilicon film 2 only in a region coated with the resist pattern 4. As an etching means, for example, a dry etching method (RIE, ICP, CDE (Chemical Dry Etching), and the like) using a gas such as $CF_4$ may be used. Subsequently, the resist pattern 4 is peeled off (FIG. 1(d)). This peeling can be carried out with, for example, a peeling solution, which is heated up to 80° C., (104 Peeling Solution manufactured by TOKYO OHKAKOGYO CO., LTD., etc.). Specifically, the resist pattern together with the substrate is exposed to the peeling solution, washed with isopropanol and water and then dried.

Next, the surface-oxidized layer 3 is etched and removed by exposing it to dilute hydrofluoric acid, etc. (FIG. 1(e)). During the treatment with dilute hydrofluoric acid, in order to avoid impurities eluted from the glass substrate 1 into dilute hydrofluoric acid from remaining on the surface of the polysilicon, dilute hydrofluoric acid preferably is dripped while rotating the substrate. Thus, a clean dilute hydrofluoric acid always is supplied onto the substrate and old dilute hydrofluoric acid in which the oxidized layer dissolves is shaken off. The concentration of hydrofluoric acid in dilute hydrofluoric acid is suitably in the range from about 0.2–1% and the treatment time may be about 10–120 seconds.

After the oxidized layer is removed, a gate insulating film 5 is deposited on the entire surface rapidly. As the gate insulating film, a $SiO_2$ film may be deposited on the entire surface to the thickness of, for example, 100 nm by a plasma CVD method by using, for example, tetraethoxysilane (TEOS) as a raw material gas. Thereafter, a gate electrode 6 made of, for example, Ta is formed to the thickness of 400 nm. Then, ion doping of phosphorus is carried out by using this gate electrode 6 as a mask, thereby forming impurity implantation regions (source and drain regions) 7 in the polysilicon film 2. Furthermore, as an interlayer insulating film 8, a $SiO_2$ film is deposited on the entire surface by a plasma CVD method by using, for example, TEOS as a raw material gas, then contact holes 9 are formed, and for example, aluminum is deposited thereon by a sputtering method to form a source electrode and a drain electrode 10. Finally, these electrodes are subjected to patterning by photolithography and etching, thereby completing a polysilicon TFT (FIG. 1(i)).

(Second Embodiment)
[Doping of Impurity Ions Into Silicon Thin Film]

In a second embodiment, an example in which the present invention is used in a step of doping impurity ions into a polysilicon film in the manufacturing process of a polysilicon TFT will be explained.

Figure 2:
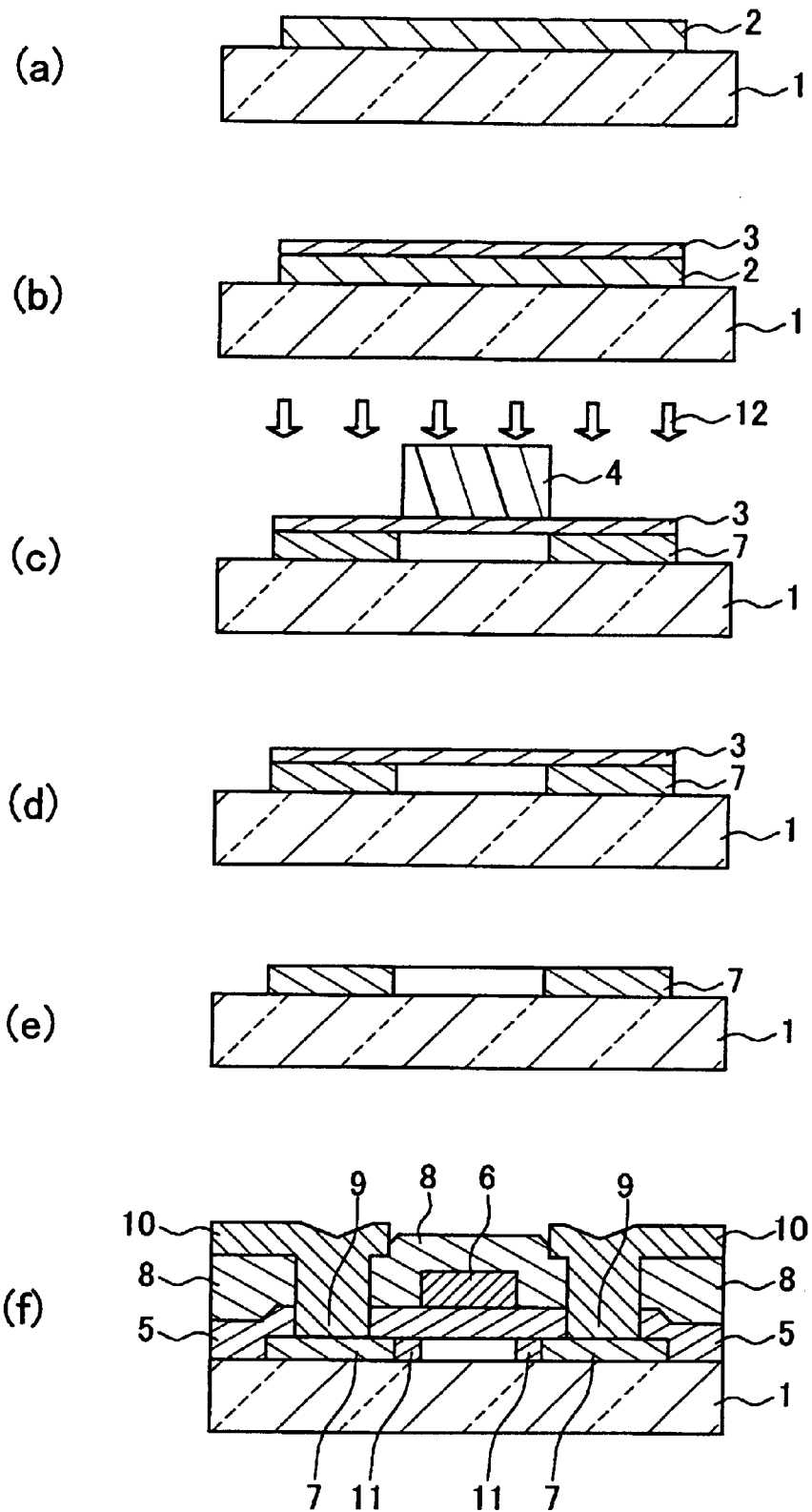
FIG. 2 is a view showing steps of a manufacturing method according to another embodiment of the present invention.

First, a polysilicon film 2 is formed in an island pattern in only a region in which a TFT is formed on a glass substrate 1 (FIG. 2(a)). In this patterning, a conventional method may be used (FIGS. 6(a) to 6(e)). However, it is preferable that the method explained in the first embodiment with reference to FIGS. 1(a) to 1(e) is used.

Next, the surface of the polysilicon film 2 is oxidized with ozone water to form a surface-oxidized layer 3 with a thickness of 1–5 nm (FIG. 2(b)). This oxidation may be carried out under the conditions mentioned above.

Furthermore, a step of selectively forming impurity implantation regions 7 on the polysilicon film 2 by photolithography and ion doping is performed (FIG. 2(c)). In the step of photolithography, a resist pattern 4 is formed on a region in which impurities are not implanted into the polysilicon film 2. In the subsequent ion-doping step, an ion-doping using, for example, a plasma of hydrogen-diluted phosphine ($PH_3$), is carried out at an acceleration voltage of 20 kV and a dose of $8 \times 10^{14}/cm^2$, thereby selectively implanting ions 12 into the polysilicon film 2 to form impurity implantation regions (a source region and a drain region) 7.

Figure 7:
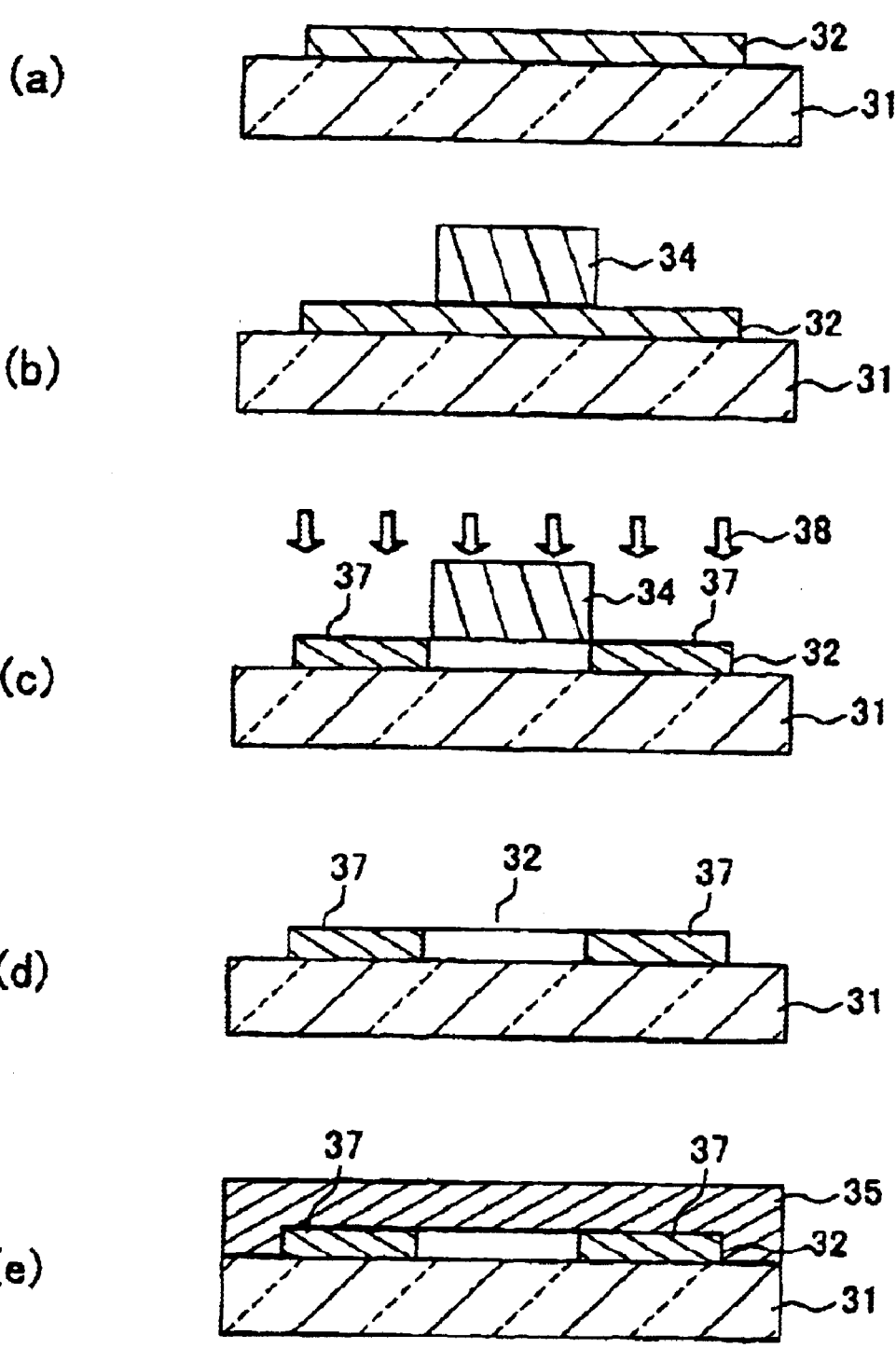
FIG. 7 is a view showing steps of another example of a manufacturing process of a conventional TFT.

Note here that, as in a conventional method, if the impurity ions are implanted directly into the polysilicon film 32 (FIG. 7(c)), the crystallinity of polysilicon may be deteriorated in some cases. On the other hand, since in this embodiment, ions are implanted into the polysilicon film via the surface-oxidized layer 3, it also is possible to reduce the deterioration of the crystallinity of polysilicon.

Subsequently, the resist pattern 4 is peeled off (FIG. 2(d)), and then the surface-oxidized layer 3 is removed (FIG. 2(e)). The resist pattern and the surface-oxidized layer 3 may be removed by the method explained in the first embodiment.

Thereafter, as a gate insulating film 5, for example, a $SiO_2$ film is deposited on the entire surface to the thickness of 100 nm. As a gate electrode 6, for example, Ta is formed to the thickness of 400 nm so that the width thereof becomes narrower than that of the resist pattern 4. Then, by using this gate electrode 6 as a mask, an ion-doping using, for example, a plasma of, for example, hydrogen-diluted phosphine ($PH_3$), is carried out at an acceleration voltage of 70 kV and a does of $2 \times 10^{13}/cm^2$, thereby forming a low impurity region 11 (Lightly Doped Drain: LDD region) on the polysilicon film 2. In order to activate the implanted ions more reliably, annealing at 400° C. or more and local heating by RTA (Rapid Thermal Anneal) further may be carried out. Subsequently, as the interlayer insulating film 8, a $SiO_2$ film is deposited on the entire surface, then the contact holes 9 are formed and then the source electrode and the drain electrode 10 made of, for example, aluminum are provided. Thus, a polysilicon TFT is completed (FIG. 2(f)).

Figure 5:
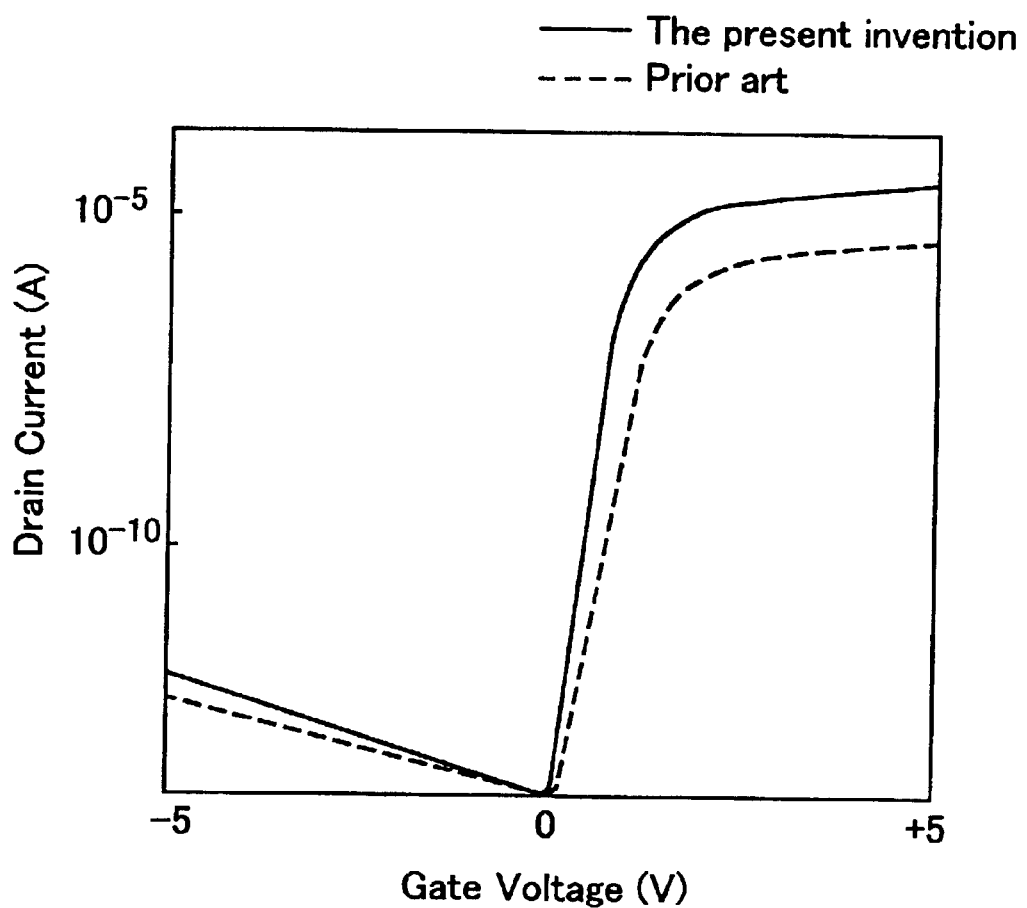
FIG. 5 is a graph showing the dependences of a drain current on a gate voltage in a TFT obtained by one embodiment of the present invention and a conventional TFT.
Figure 6:
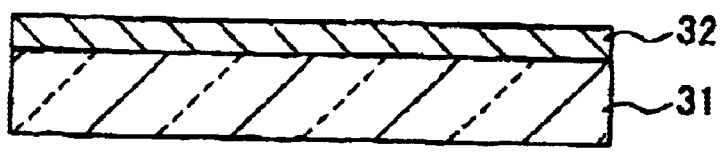
FIG. 6 is a view showing steps of one example of a manufacturing process of a conventional TFT.
Figure 6:
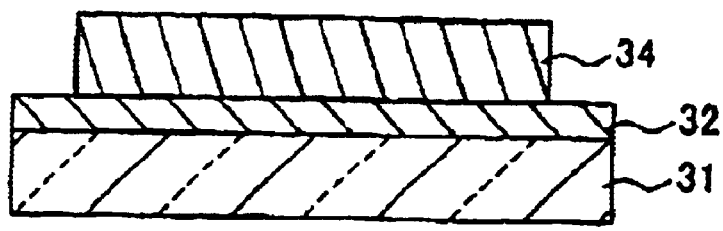
Figure 6:
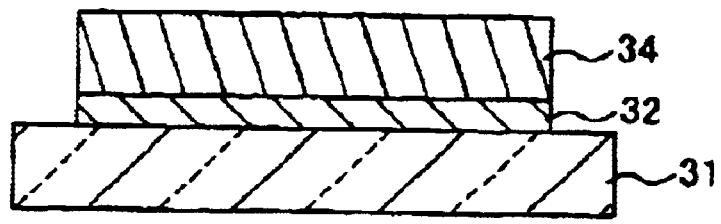
Figure 6:
Figure 6:
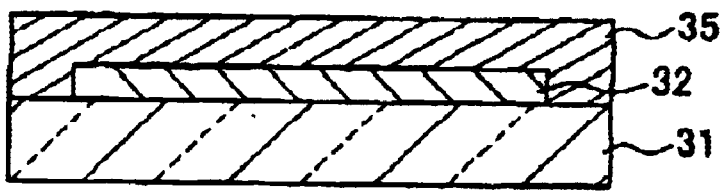

The dependence of the drain current of the TFT obtained by the first and second embodiments on a gate voltage (Id-Vg property) was measured. The result is shown in FIG. 5. For comparison, the characteristics are shown with respect to a TFT manufactured by the same process except that the surface-oxidized layer is not formed on the polysilicon film at the time of ion implantation. It is shown that the TFT obtained by using the present invention has an excellent transistor property with the ON-state current high and the rise steep. Note here that, in another comparative example of a TFT manufactured by the same process as in the above-mentioned embodiment except that the surface-oxidized layer is not formed at the time of patterning of the polysilicon film, substantially the same characteristics as that shown in the drawings can be obtained.

(Third Embodiment)
[Etching Process of Insulating Film]

In a third embodiment, an example in which the present invention is used in a step of etching an etching stopper layer in the manufacturing process of a polysilicon TFT will be explained.

First, an amorphous polysilicon film 22, an insulating layer 15 to be used as an etching stopper and a resist pattern 4 are deposited on a substrate 1 in this order (FIG. 3(a)). The amorphous polysilicon film 22 can be formed by the same manner as in the first embodiment and may be crystallized by a laser annealing process and the like, as explained in the embodiment, but herein is used in an amorphous state. As the insulating film 15, for example, a silicon nitride film, a silicon oxide film, a silicon oxynitride film, etc. may be used. The film thickness may be about 5–200 nm. Also the resist pattern 4 can be formed by using a photoresist as in the first embodiment.

Next, the insulating film 15 is etched by using a resist pattern 4 formed in a predetermined pattern as a mask (FIG. 3(b)). This etching may be carried out with, for example, buffered hydrofluoric acid.

Figure 3:
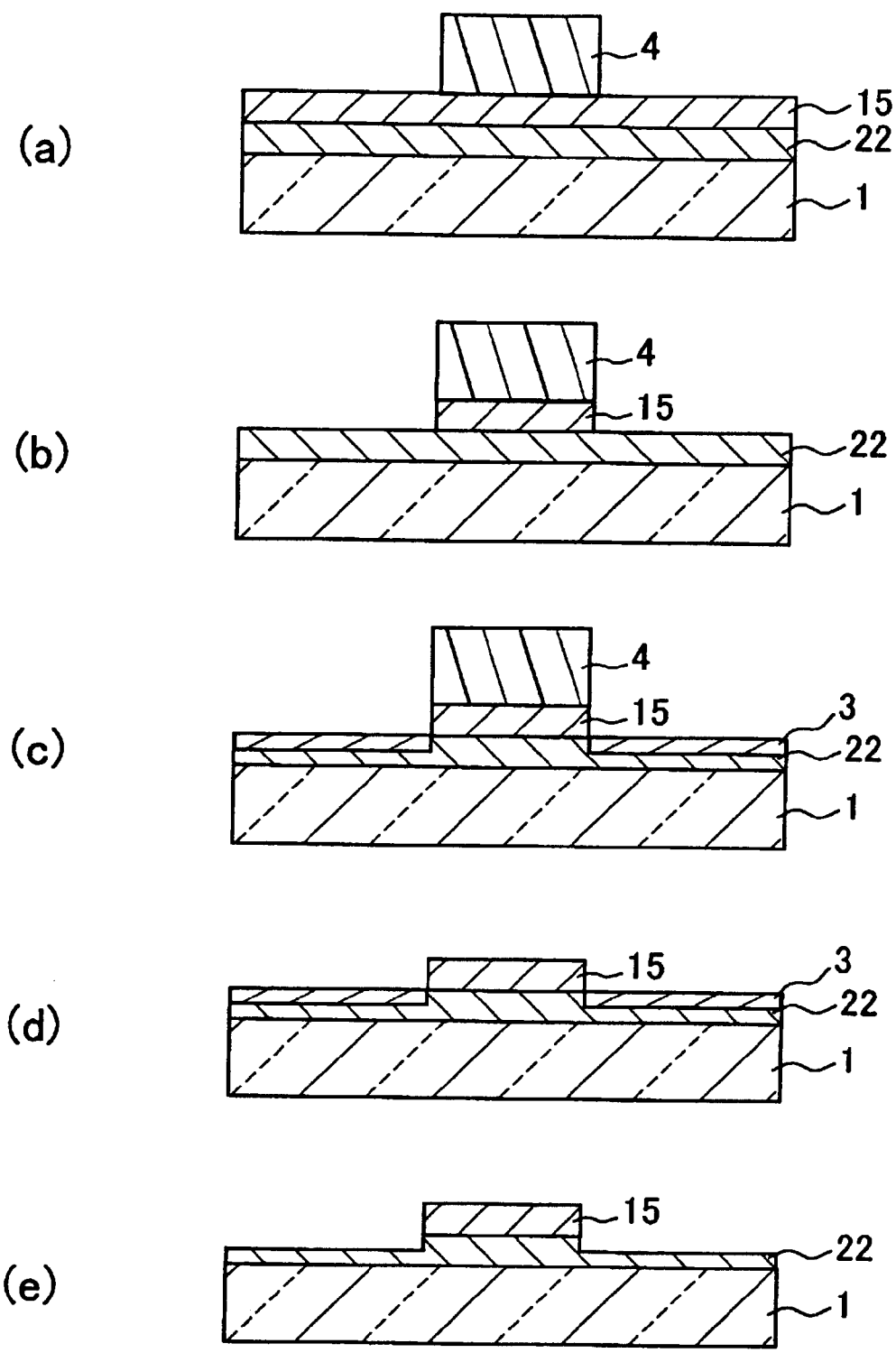
FIG. 3 is a view showing steps of a manufacturing method according to a still another embodiment of the present invention.

Furthermore, the surface of the amorphous silicon film 22 is brought into contact with ozone water to form a surface-oxidized layer 3 (FIG. 3(*c*)). The surface-oxidized layer 3 can be formed by the same method as in the first embodiment.

In this embodiment, the surface-oxidized layer 3 is formed after etching. In the first and second embodiments, a resist pattern is formed directly on the semiconductor film (polysilicon film). Therefore, the surface-oxidized layer is formed before the resist pattern is formed so that the surface of the semiconductor film is not exposed from the region in which the resist is removed after the resist pattern is removed. On the other hand, in this embodiment, in a region in which a resist pattern is formed, the insulating film 15 is interposed in advance. Therefore, after the resist pattern is formed, the surface-oxidized layer may be formed (only in the region in which a resist pattern is not formed). In order to prevent the surface-oxidized layer 3 from being removed at the same time the insulating film 15 is etched away, as mentioned above, it is preferable that the surface-oxidized layer 3 is formed on the surface of the exposed semiconductor film after the etching of the insulating film 15.

Subsequently, the resist pattern is peeled off (FIG. 3D) and the surface-oxidized layer 3 is etched away (FIG. 3E). These steps may also be carried out by the same method as in the first embodiment.

Figure 4:
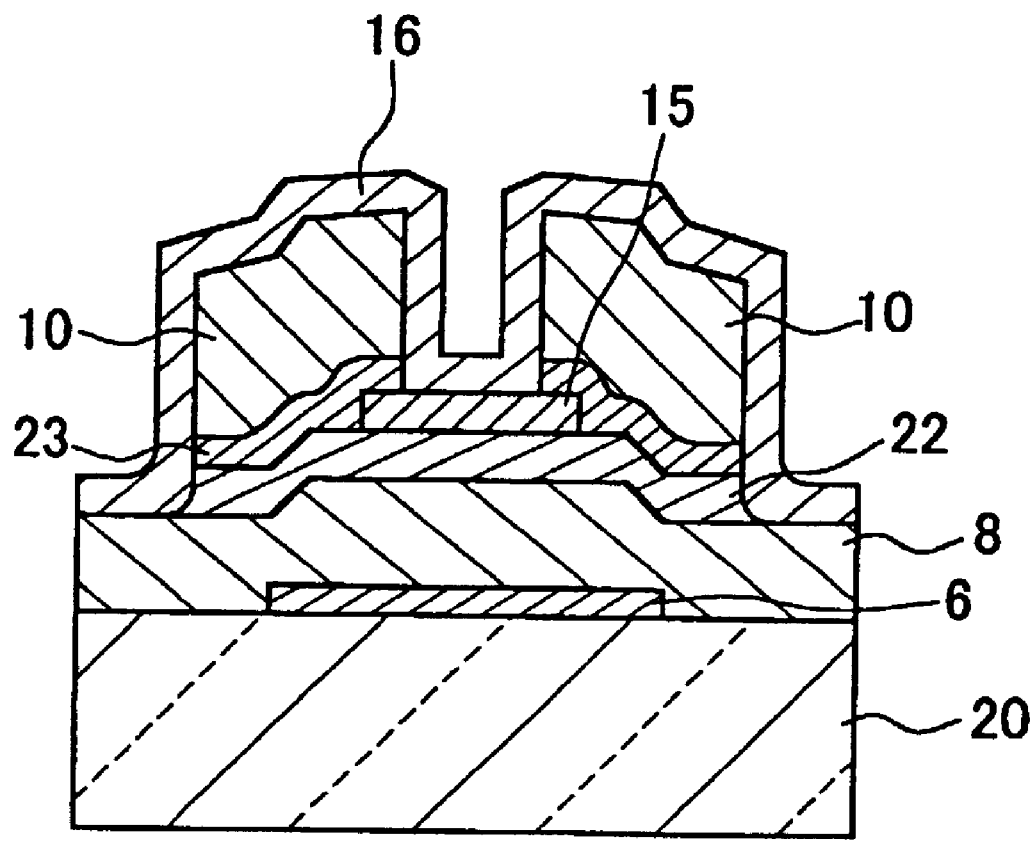
FIG. 4 is a cross-sectional view showing an example of a TFT manufactured by the embodiment shown in FIG. 3.

The insulating film 15 thus formed on the amorphous film 22 is used as an etching stopper layer when etching is carried out for separating both source and drain electrodes 10 in, for example, a step for manufacturing a TFT as shown in FIG. 4. Note here that in the TFT shown in FIG. 4, between the amorphous silicon film 22 and the glass plate 20, the gate electrode 6 and the gate insulating film 8 are formed in advance. However, in FIG. 3, the detailed structure of these lower parts is not shown in the drawings in detail and collectively is shown as the substrate 1. Reference numeral 16 in FIG. 4 denotes a surface protection film and 23 denotes a n$^+$ silicon film.

In the first and second embodiments, a resist pattern is formed on the surface-oxidized layer after the surface-oxidized layer is formed on the surface of the semiconductor layer, the semiconductor layer is subjected to etching or ion implantation by using the resist pattern as a mask, and then the resist pattern is removed with a peeling solution. In these embodiments, the surface-oxidized layer protects the surface of the semiconductor film from the peeling solution. On the other hand, in the third embodiment, the resist pattern is formed after the insulating film is formed on the surface of the semiconductor layer, etching is carried out by using this resist pattern as a mask and then the resist pattern is removed with the peeling solution after the surface-oxidized layer is formed on the semiconductor film exposed by etching. In this embodiment, the surface-oxidized layer and the patterned insulating film protect the surface of the semiconductor film from a peeling solution.

As mentioned above, according to the present invention, damage to the surface of the silicon film in the process of manufacturing a TFT can be reduced. Thus, it is possible to provide a thin-film transistor and in turn a liquid crystal display, having excellent characteristics and reliability.

Furthermore, by using ozone-containing water, the washing step can be omitted. The omitting of the washing step leads to the reduction of waste liquid including acid such as dilute hydrofluoric acid. Furthermore, since the step of oxidation with ozone containing water can be carried out for an extremely short time as compared with the step in which an oxide film is formed by, for example, natural oxidation (the oxidation time of about 20 hours can be reduced to about 1 minute), the improvement of the manufacturing efficiency and reduction of storage space is possible. The reduction of storage space leads to the reduction of the construction cost for factory, thus saving construction materials and energy necessary for construction. Thus, the present invention provides an eco-friendly manufacturing method capable of realizing the reduction of waste water, the reduction of the effect of factory construction on the environment, and the like.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A method of manufacturing a thin-film transistor comprising:

bringing a surface of a semiconductor film formed on a substrate into contact with ozone-containing water to form a surface-oxidized layer on the surface, forming a predetermined pattern mask on the semiconductor film, carrying out either of processes selected from etching and impurity ion implantation by using the mask, removing the mask with the surface-oxidized layer being formed at least on an exposed portion of the surface of the semiconductor film, and removing the surface-oxidized layer after the mask is removed.

2. The method of manufacturing a thin-film transistor according to claim 1, further comprising removing a surface layer of the semiconductor film before the surface-oxidized layer is formed.

3. The method of manufacturing a thin-film transistor according to claim 1, wherein the thickness of the surface-oxidized layer is in the range from 0.5 nm to 5 nm.

4. The method of manufacturing a thin-film transistor according to claim 1, wherein the pattern mask is a photoresist.

5. The method of manufacturing a thin-film transistor according to claim 4, wherein the photoresist is removed with an alkaline peeling solution.

6. The method of manufacturing a thin-film transistor according to claim 1, wherein the semiconductor film is at least one selected from a polycrystalline silicon film and an amorphous silicon film.

7. The method of manufacturing a thin-film transistor according to claim 6, wherein the semiconductor film is a polycrystalline silicon film.

8. The method of manufacturing a thin-film transistor according to claim 1, wherein the substrate is a glass substrate.

9. The method of manufacturing a thin-film transistor according to claim 1, wherein the semiconductor film is etched by using the mask.

10. The method of manufacturing a thin-film transistor according to claim 1, wherein impurity ions are implanted into the semiconductor film by using the mask.

11. The method of manufacturing a thin-film transistor according to claim 1, wherein a predetermined pattern mask is formed on the semiconductor film via at least one insulating film and the insulating film is etched by using the mask.

12. The method of manufacturing a thin-film transistor according to claim 11, wherein the surface-oxidized layer is formed on an exposed portion of the surface of the semiconductor film after the insulating film is etched.

13. A liquid crystal display comprising a thin-film transistor obtained by the method as claimed in claim 1.

14. A method of manufacturing a thin-film transistor comprising:
   bringing a surface of a semiconductor film formed on a substrate into contact with ozone-containing water to form a surface-oxidized layer on the surface,
   forming a predetermined pattern mask on the semiconductor film,
   carrying out either of processes selected from etching and impurity ion implantation by using the mask,
   removing the mask with the surface-oxidized layer being formed at least on an exposed portion of the surface of the semiconductor film, and
   removing a surface layer of the semiconductor film before the surface-oxidized layer is formed.

15. The method of manufacturing a thin-film transistor according to claim 14, further comprising removing the surface-oxidized layer after the mask is removed.

16. The method of manufacturing a thin-film transistor according to claim 14, wherein the thickness of the surface-oxidized layer is in the range from 0.5 nm to 5 nm.

17. The method of manufacturing a thin-film transistor according to claim 14, wherein the pattern mask is a photoresist.

18. The method of manufacturing a thin-film transistor according to claim 17, wherein the photoresist is removed with an alkaline peeling solution.

19. The method of manufacturing a thin-film transistor according to claim 14, wherein the semiconductor film is at least one selected from a polycrystalline silicon film and an amorphous silicon film.

20. The method of manufacturing a thin-film transistor according to claim 19, wherein the semiconductor film is a polycrystalline silicon film.

21. The method of manufacturing a thin-film transistor according to claim 14, wherein wherein the substrate is a glass substrate.

22. The method of manufacturing a thin-film transistor according to claim 14, wherein the semiconductor film is etched by using the mask.

23. The method of manufacturing a thin-film transistor according to claim 14, wherein impurity ions are implanted into the semiconductor film by using the mask.

24. The method of manufacturing a thin-film transistor according to claim 14, wherein a predetermined pattern mask is formed on the semiconductor film via at least one insulating film and the insulating film is etched by using the mask.

25. The method of manufacturing a thin-film transistor according to claim 24, wherein the surface-oxidized layer is formed on an exposed portion of the surface of the semiconductor film after the insulating film is etched.

26. A liquid crystal display comprising a thin-film transistor obtained by the method as claimed in claim 14.

* * * * *